United States Patent
Jones et al.

(10) Patent No.: US 12,035,158 B2
(45) Date of Patent: Jul. 9, 2024

(54) AUTOMATED REMOTE CONTROL TESTER

(71) Applicant: DISH Network L.L.C., Englewood, CO (US)

(72) Inventors: Kenneth Jones, Palmer Lake, CO (US); SvitLana Trygubova, Lakewood, CO (US); Jerome A. LaPalme, Aurora, CO (US); Jamie Metzger, Aurora, CO (US); Henry Gregg Martch, Parker, CO (US)

(73) Assignee: DISH Network L.L.C., Englewood, CO (US)

( * ) Notice: Subject to any disclaimer, the term of this patent is extended or adjusted under 35 U.S.C. 154(b) by 843 days.

(21) Appl. No.: 17/132,033

(22) Filed: Dec. 23, 2020

(65) Prior Publication Data
US 2022/0201514 A1    Jun. 23, 2022

(51) Int. Cl.
*G01R 31/385* (2019.01)
*G01M 99/00* (2011.01)
(Continued)

(52) U.S. Cl.
CPC ......... *H04W 24/06* (2013.01); *G01M 99/005* (2013.01); *G08C 17/02* (2013.01);
(Continued)

(58) Field of Classification Search
CPC .............. G01R 31/385; G01R 31/3277; G01R 31/31912; G01R 31/318314;
(Continued)

(56) References Cited

U.S. PATENT DOCUMENTS

| | | | |
|---|---|---|---|
| 2010/0013654 A1* | 1/2010 | Williams | B65G 43/00 340/676 |
| 2013/0128941 A1* | 5/2013 | Langer | G08C 17/02 375/228 |

(Continued)

FOREIGN PATENT DOCUMENTS

CN    106097700    * 11/2016

OTHER PUBLICATIONS

"ADG2188 Data Sheet", Downloaded from Internet at https://www.analog.com/media/en/technical-documentation/data-sheets/ADG2188.pdf, on Dec. 13, 2020, Publisher: Analog Devices.
(Continued)

*Primary Examiner* — Thang X Le
(74) *Attorney, Agent, or Firm* — Wash Park IP Ltd.; John T. Kennedy (57) ABSTRACT

A device for testing remote controls includes a main board, a data acquisition module (DAM), and one or more testing components. The main board communicates a testing instruction to the testing components which, then provide stimuli to a remote under test (RUT). The DAM receives, from the testing components, result data indicative of reaction(s) by the RUT to the stimuli. At least one of the stimuli is provided to the RUT and the result data is received by the DAM from the testing components. A first testing component provides a first stimuli to the RUT substantially simultaneously with a second testing component providing a second stimuli to the RUT. The first stimuli may include an acceleration of the RUT and the second stimuli may emulate a user action. The emulated user action emulates a button press, a button release, an audible input, and a touch screen action.

16 Claims, 2 Drawing Sheets

(51) Int. Cl.
*G08C 17/02* (2006.01)
*G08C 23/04* (2006.01)
*H04W 24/06* (2009.01)

(52) U.S. Cl.
CPC ............ *G08C 23/04* (2013.01); *G01R 31/385* (2019.01); *G08C 2201/31* (2013.01)

(58) Field of Classification Search
CPC ............ G01R 31/2817; G01R 31/2825; G01R 31/2844; G01R 31/2834; G01R 31/2808; G08C 23/04; G08C 17/02; G08C 2201/31
See application file for complete search history.

(56) References Cited

U.S. PATENT DOCUMENTS

| | | | | |
|---|---|---|---|---|
| 2014/0107976 A1* | 4/2014 | Kallfelz | ............ | H01M 10/4285 |
| | | | | 702/182 |
| 2014/0197857 A1* | 7/2014 | Partee | ............ | G01R 1/02 |
| | | | | 324/756.07 |
| 2014/0320670 A1* | 10/2014 | Wang | ............ | G08C 17/02 |
| | | | | 348/180 |
| 2021/0092541 A1* | 3/2021 | Tiwari | ............ | H04R 29/00 |

OTHER PUBLICATIONS

Digilent Analog Discovery, Downloaded from the Internet at https://reference.digilentinc.com/reference/instrumentation/analog-discovery-2/start, on Nov. 6, 2020, Publisher: Digilent.

"What is LabVIEW?", Downloaded from the Internet at https://www.ni.com/en-us/shop/labview.html?cid=Paid_Search-a243q000005MiCfAAK-Consideration-Google_LabVIEW_LabVIEW&s_kwcid=AL!6304!3!449107487676!e!!g, on Dec. 13, 2020, Publisher: National Instrument.

"RF4CE—Compliant Platforms Help Simplify Remote Control Design", Downloaded from the Internet at https://www.digikey.com/en/articles/rf4ce-compliant-platforms-help-simplify-remote-control-design?utm_adgroup=General&utm_source=google&utm_medium=cpc, on Nov. 6, 2020, Publisher: Digikey Electronics.

* cited by examiner

AUTOMATED REMOTE CONTROL TESTER

TECHNICAL FIELD

The technology described herein generally relates to devices, systems, and processes for testing remote controls.

BACKGROUND

Devices, systems, and processes are needed for testing remote controls and similar user-to-apparatus interface devices. As is commonly well known, remote control devices are available in various size, shapes, and configurations. Remote control devices (herein, a "remote") may be used to control, for example and not by limitation, television receivers, satellite and cable set top boxes, gaming systems, audio equipment, fans, blinds, lights, thermostats, and practically any electrically controllable device (herein, an "appliance"). A remote may be used to control multiple appliances. A remote may include numerous "user input components" and "user output components". Non-limiting examples of user input components include buttons, touch pads, motion sensors, microphones, and the like. Non-limiting examples of user output components include visible elements (such as light emitting diodes (LEDs) and other display forms), audible elements (such as speakers), tactile and haptic elements (such as vibration and touch elements), and others. Using one or more user input component(s), a user may request, via a remote, an applicant to perform one or more actions. The providing of the request is herein identified as a "user action" which provide one or more "user instructions" to a given appliance via a given remote. Often a user output component provides a response indicating that the user instruction was received by the remote, such as activating an LED or generating a beeping sound. Non-limiting examples of user actions include button pressing, swipes, shaking, tilting, rotating, verbal inputs, or otherwise. Non-limiting examples of user instructions for an appliance include volume adjustments, powering an appliance on/off, changing channels, and otherwise.

Often a user input component, such as a button, may be associated with multiple possible user actions and user instructions. For example, a pressing of a button for a second may result in a first user instruction being provided by the remote to one or more appliances, while the pressing of the same button for two seconds may result in a second user instruction being provided by the remote to the appliance(s). Further, numerous combinations, and permutations of user actions, whether by button press, swipe, shaking, or otherwise, may result in one or more user instructions being sent by a given remote to the appliance(s). Accordingly, it is commonly appreciated that a given remote will often have a large number of possible permutations, combinations, and the like of user actions that are associated with one or more user input components and with one or more user instructions.

Further, a remote may be operable such that upon receiving a given user action, the remote performs one or more "remote actions" that may include generating one or more "remote output signals" such as an emitted signal that instructs one or more appliances to perform one or more user instructions. Such remote actions may include those performed by the remote itself as well as the providing of remote output signals, with such signals typically being communicated to an appliance in a wireless signal. For a non-limiting example, a user action (and associated user instruction) for powering "ON" a home theater may result in the remote illuminating an LED (a "remote action"), while also generating numerous remote output signals, such as the emitting of a sequence of radio frequency (RF) and/or infrared (IR) signals, which include user instructions for one or more appliances, such as powering on a projector, decreasing an output volume of a sound system, dimming lights, lowering blinds, and otherwise.

Remotes typically include a combination of hardware and software. Components of remotes are well known and any current or later arising remote technology may be used in accordance with an implementation of the present disclosure. The hardware generally includes mechanical components, such as buttons, button sensors, capacitive touch interfaces, data processors, persistent data storage devices, power components, communication elements, such as transceivers, interface components, such as Universal Serial Bus (USB) interfaces, and the like. The software is typically provided, as firmware, in a persistent form that may be updated from time to time by a firmware update. The updating of firmware in remotes is well known. When such firmware is updated, one or more of the various selections, permutations, and combinations of user actions may need to be tested and verified as corresponding to one or more user instructions as well as resulting in one or more remote output actions.

Commonly today, remote firmware verification is accomplished by human involvement with an updated remote. Such human involvement may include numerous user actions, such as button presses, button press combinations, shaking of the remote, and otherwise. Given the vast number of permutations and combinations of possible intended user actions and unintended user actions (e.g., user actions that may occur randomly), approaches are needed for automated remote testing.

SUMMARY

The various implementations of the present disclosure relate in general to devices, systems, and processes for testing remotes.

In accordance with at least one implementation of the present disclosure, a device may include a main board; a data acquisition module (DAM) coupled to the main board. One or more testing components may be coupled to the main board. The main board may be operable to communicate a testing instruction to the one or more testing components. Based on the testing instruction, the one or more testing components provide one or more stimuli to a remote under test (RUT). The DAM may be operable to receive, from the one or more testing components, one or more result data indicative of one or more reactions by the RUT to the one or more stimuli.

An implementation feature may include a device where at least one of the one or more stimuli may be provided to the RUT and at least one of the one or more result data may be received by the DAM from at least one of the one or more testing components. A first testing component may provide a first stimuli to the RUT substantially simultaneously with a second testing component providing a second stimuli to the RUT. The first stimuli may be an acceleration of the RUT. The second stimuli may be an emulated user action. The emulated user action may emulate at least one of a button press, a button release, an audible input, and a touch screen action.

The one or more testing components may include a crosspoint switch operable to generate an emulated user action. The one or more stimuli may include at least one emulated user action. The RUT may include a remote battery. The one or more testing components may include a current monitor, coupled to the DAM. The current monitor may be operable to capture a testing result corresponding to the one or more reactions by the RUT and provide the test result to the DAM. The testing result may be a change in a discharge current from the remote battery. The testing result may be captured by the current monitor in response to the providing of the one or more stimuli to the RUT. The test result may be captured by the current monitor substantially simultaneously with the providing of the one or more stimuli to the RUT.

The one or more testing components may include a cradle operable to hold the RUT. A motor may be included, physically coupled to the cradle, and operable to rotate the cradle about at least one axis of a coordinate system. The one or more stimuli may include a rotation of the cradle imparting a rotation to the RUT.

The one or more testing components may include a crosspoint switch operable to generate an emulated user action. A radio frequency (rf) transceiver and an infrared (IR) transceiver may be included. The one or more stimuli may include at least one emulated user action. The RUT may be operable to generate at least one of an RF signal and an IR signal. The one or more result data may include at least one of the RF signal and the IR signal generated by the RUT and in reaction to the one or more stimuli.

The one or more testing components may include a crosspoint switch operable to generate an emulated user action. A light emitting diode (LED) operable to provide a light environment to the RUT may be included. A camera operable to capture one or more images of the RUT and at least one of the one or more reactions by the RUT to the one or more stimuli may be included. One or more reactions by the RUT may include an illumination of a remote LED.

The one or more testing components may include a crosspoint switch operable to generate an emulated user action. A sound module operable to output a sound to the RUT may be included. The sound module may be operable to capture a sound reaction from the RUT. The sound reaction may be generated by the RUT as at least one of the one or more reactions by the RUT to the one or more stimuli. The sound reaction may include one or more humanly perceptible words.

At least one implementation of the present disclosure may include a device that includes a hardware processor operable to execute non-transient computer executable instructions facilitating a testing engine. The testing engine may be operable to generate at least one testing instruction based upon at least one testing script. The hardware processor may output the at least one testing instruction to an automated remote testing system.

An implementation feature for the device may include a data storage device, coupled to the hardware processor. The data storage device may include a database that may include a remote data set identifying one or more device types, a script data set providing one or more scripts, a module data set providing one or more modules, and a parameter data set providing one or more parameters. The testing engine may generate at least one testing instruction based upon a combination of at least two or more of a remote type, a script, a module, and a parameter. The testing engine may be operable to randomly generate the combination.

At least one implementation of the present disclosure may include an automated remote testing (ART) system that includes a main board, a data acquisition module (DAM) coupled to the main board, and one or more testing components coupled to the main board. The main board may be operable to communicate a testing instruction to the one or more testing components. Based on the testing instruction, the one or more testing components may provide one or more stimuli to a RUT. The DAM may be operable to receive, from the one or more testing components, one or more result data indicative of one or more reactions by the RUT to the one or more stimuli. An implementation of the system may include a testing executive. The testing executive may include a hardware processor operable to execute non-transient computer executable instructions facilitating a testing engine. The testing engine may generate the testing instruction based upon at least one testing script, and where the hardware processor outputs the testing instruction to the art system.

An implementation feature may include a crosspoint switch operable to generate an emulated user action. The one or more stimuli may include at least one emulated user action. A cradle operable to hold the RUT may be included in the system. A motor may be included. The motor may be physically coupled to the cradle and operable to rotate the cradle about at least one axis of a coordinate system. The one or more stimuli may include a rotation of the cradle imparting a rotation to the RUT.

BRIEF DESCRIPTION OF THE DRAWINGS

The features, aspects, advantages, functions, modules, and components of the devices, systems and processes provided by the various implementations of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When the first reference label is used in the specification, the description is applicable to any of the similar components and/or views having the same first reference number irrespective of any additional alphabetic designators or second reference labels, if any.

DETAILED DESCRIPTION

The various implementations described herein are directed to devices, systems, and processes for automated remote testing (ART).

Figure 1A:
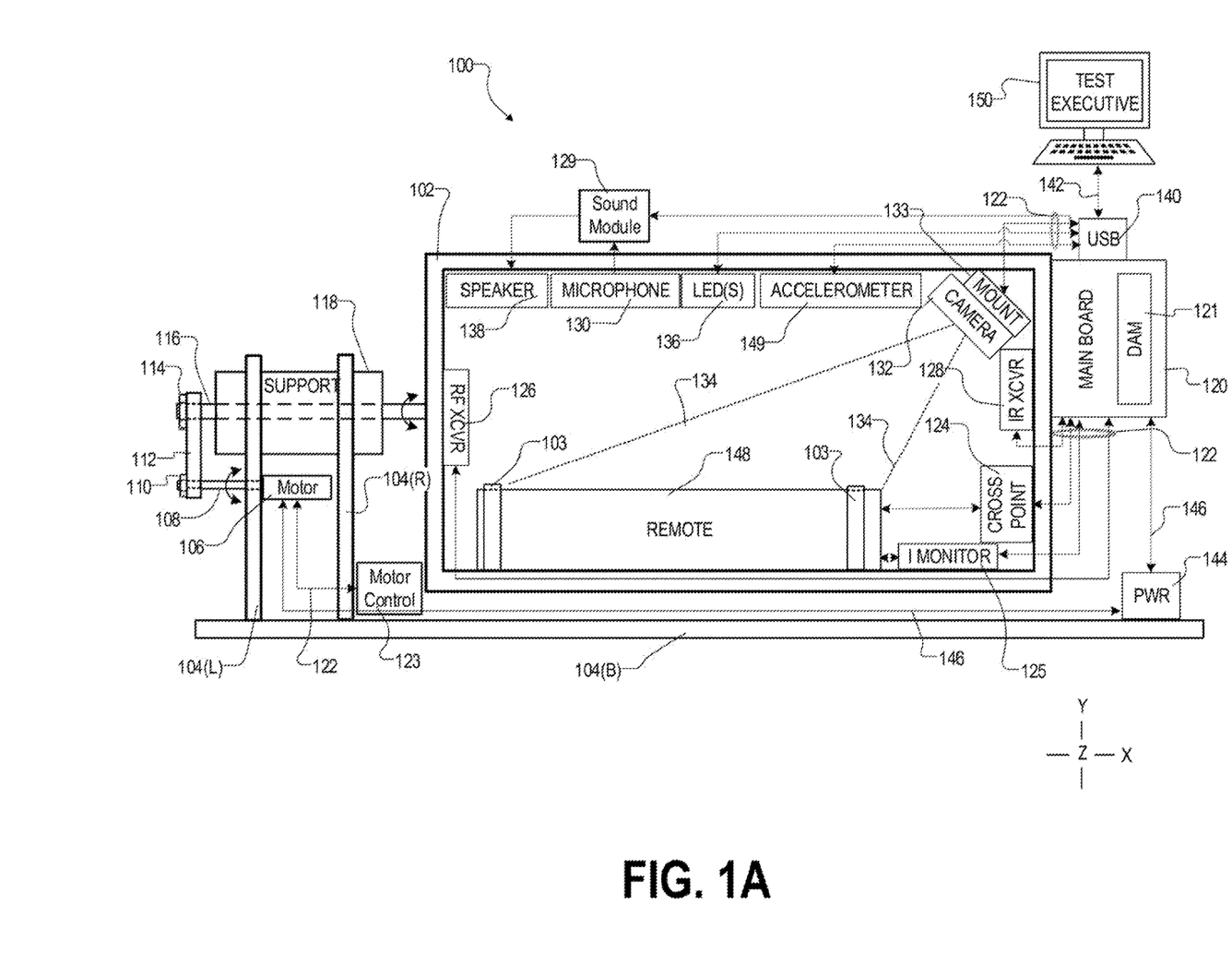
FIGS. 1A and 1B are an illustrative diagram of an automated remote testing ("ART") system and in accordance with at least one implementation of the present disclosure.

As shown in FIG. 1A and for least one implementation of the present disclosure, an ART system 100 is disclosed for use in testing a remote 148 (not part of the system) operable for use with one or more appliances (not part of the system). As discussed above, the appliance may be any form of electrical/electronic device operable to receive a remote output signal and perform one or more user instructions. Non-limiting examples of appliances include televisions, stereo receivers, cable set top boxes, 10-foot devices, satellite receivers, gaming devices, personal computers, tablet computing devices, smartphones, blinds, lights, thermostats, doorbells, security systems, and the like. For at least one implementation, the ART system 100 may be operable to securely position and retain a remote 148 during testing operations and using one or more testing components. Non-limiting examples of testing components include a motor 106, crosspoint switch 124, current monitor 125, radio frequency (RF) transceiver 126, infrared (IR) transceiver 128, sound module 129, microphone(s) 130, camera 132, one or more LED(s) 136, speaker(s) 138, and an accelerometer 149 (these components are described below). Combinations of the foregoing testing components and/or other testing components may be used for a given implementation of the present disclosure. The one or more testing components, singularly, collectively, and/or in any combination, permutation, or otherwise provide one or more "stimuli" to the remote under test. As used herein, a "stimuli" is any one or operations, emulated user actions, environments or the like used during testing of a remote. Non-limiting examples of "stimuli" include rotations of a remote, emulated button actions, such as button presses, button releases, audible inputs, light, heat, sound, RF, or other environmental exposures, and others. One or more of the testing components capture one or more "reactions" by the remote to the one or more stimuli. Non-limiting examples of remote "reactions" include generation of user instructions for use by one or more appliances, changes of display images, generation of sounds and absences thereof, (non)illumination of lights, and others.

Cradle 102

As shown, an ART system 100 may include a cradle 102 or other structure operable for holding the remote 148 and one or more testing components. The cradle 102 may be made of any material. For at least one implementation, the cradle 102 may be made of materials that are one or more of electrically non-conductive, RF and/or IR signal non-interfering and/or non-reflective, sound absorptive and/or non-reflective, light absorptive and/or non-reflective, and otherwise. Materials having such one or more properties are well known in the art and are not further identified herein. Any known or later arising materials may be used.

For other implementations, the cradle 102 may be operable of materials that provide one or more of, less than all of, the opposite properties of, or otherwise of those identified above and other properties. It is to be appreciated that a cradle 102 may be operable so as to emulate an expected environment in which a remote is intended for use, likely to be used, and/or otherwise. To provide a given environment, the cradle may include one or more cradle sides (not shown). Such cradle sides may be operable in any various forms and of any material(s) and/or combinations thereof. For a non-limiting example, when RF isolation is specified for a given testing script, the cradle sides may be operable to provide RF signal isolation by use of a Faraday cage or similar arrangement.

Fasteners 103

As shown, one or more fasteners 103 may be used to secure a remote 148 to the cradle 102. The fasteners 103 may use any suitable form, including but not limited to, clamps, screws, brackets, magnetic retention, zip ties, or the like. The fasteners 103 may be operable to prevent movement of the remote 148 relative to the cradle 102.

Frame 104

The cradle 102 may be coupled to a frame 104. The frame 104 may include, for at least one implementation, a left vertical frame 104(L) and a right vertical frame 104(R) that are attached to a base 104(B). Other frame configurations may be used for other implementations. The frame 104 may be operable of any material suitable for an intended use of the ART system 100. As described herein, the cradle 102 may be suspended above the base 104(B) and rotatable about one or more axes. As shown for an implementation, the cradle 102 may be rotated (perform a "roll") about an "X" axis of an "X-Y-Z" coordinate system.

Motor 106

To facilitate rotation of the cradle 102, the ART system 100 may include a motor 106, for example and not by limitation, a stepper motor. Any known or later arising motor technologies may be used. The motor 106 rotates a drive shaft 108. The drive shaft 108 is coupled by a first pulley 110, a belt 112, and a second pulley 114 to a cradle shaft 116. The first pulley 110 and the second pulley 114 may be geared and a gearing ratio therebetween may be provided. For example, a 2×1 gearing ratio may be used such that for two rotations of the drive shaft 108 a rotation of the cradle shaft 116 occurs. Other gearing ratios may be used. The first pulley 110, belt 112, and second pulley 114 may be fabricated and configured in accordance with known or later arising technologies. The cradle shaft 116 may be positioned using a support assembly 118 coupled to the left vertical frame 104(L) and to the right vertical frame 104(R). The support assembly 118 may include one or more bearings or similar components that facilitate rotation of the cradle shaft 116 while maintaining the orientation and position of the cradle shaft 116 within the ART system 100. The motor 106 may be coupled to one or more of the left vertical frame 104(L), the right vertical frame 104(R), the support assembly 118, the base 104(B), or otherwise. The cradle shaft 116 may be supported by the support assembly 118. For an implementation, the support assembly 118 may be configured to facilitate movement and/or rotation of the cradle 102 along and/or about one or more of the "X" axis, the "Y" axis (for example, a change of "pitch") and/or "Z" axis (for example, a change of "yaw"). For an implementation, the frame 104 may be operable such that one or more of the pitch, roll, or yaw of the cradle 102 and/or the location of the cradle 102 at a given time in the X-Y-Z coordinate space is variable and/or fixed during execution of one or more testing scripts.

Main Board 120

The ART system 100 may include a main board 120. The main board 120 may be provided as a collection of electrical components on a printed circuit board (PCB). For an implementation, the main board 120 may include use of one or more application specific integrated circuits (ASIC), as a collection of circuit components, such as resistors, capacitors, diodes, transistors, and otherwise. For at least one implementation, the main board 120 may include instrumentation amplifiers, signal conditioners, and other analog and/or digital signal processing elements.

Any known or later arising technologies may be used for the main board 120 and the electrical components facilitating the various elements of the ART system 100.

Data Acquisition Module (DAM) 121

The main board 120 may include and/or be coupled to a data acquisition module ("DAM") 121. For at least one implementation, an "Analog Discovery 2" module manufactured by DIGILENT, of Pullman, Washington, USA may be used as the DAM 121. Any known or later arising technologies may be used for the DAM 121. For at least one implementation, the DAM 121 may directly and/or indirectly couple the main board 120 to a USB port 140, to one or more data connectors 122, to a test executive 150, or otherwise.

Data Connectors 122

One or more data connectors 122 may be used to communicate data between electrical components in the ART system 100 including, but not limited to, between the main board 120, the DAM 121, the motor 106, via e.g., a motor controller 123, and otherwise. Non-limiting examples of data connectors 122 include USB cables, firewire cables, copper twisted pair cable, copper wires, RG6 cables, serial cable, parallel cables, coaxial cables, fiber optic cables, and others. Any known or later arising technologies operable for communicating data (as represented by one or more electrical signals) via wired or wireless signals and between two or more electrical devices may be used.

Motor Controller 123

The main board 120 may be coupled to a motor controller 123 which is operable for controlling one or more operations of the motor 106. Any known or later arising technology may be used for the motor controller 123. The motor controller 123 used for a given implementation may be specific, common, universal, or otherwise with respect to a given motor 106 or any motor. For at least one implementation, the motor controller 123 may be operable for use with a stepper motor. The motor controller 123 may be provided in whole with, in part with and/or separate from the main board 120. In FIG. 1A, the motor controller 123 is shown as being located proximate to the motor 106 for purposes of illustration and not by limitation. For at least one implementation, the motor controller 123 is coupled to the DAM 121.

Crosspoint Switch 124

The main board 120 may be coupled directly or indirectly, e.g., via a DAM 121, to a crosspoint switch 124. The crosspoint switch 124 may be provided in conjunction with or separate from the main board 120. In FIG. 1A, the crosspoint switch 124 is shown as being located proximate to the remote 148 for purposes of illustration and not by limitation. For at least one implementation, a crosspoint switch 124 having an eight-by-eight (8×8) device array configuration may be used. Other configurations may be used for other implementations. For at least one implementation, an ADG2188 crosspoint switch manufactured by Analog Devices of Norwood, Massachusetts, USA may be used. The crosspoint switch 124 may be operable for connecting to one more test points (not shown) provided by a given remote 148 to the ART system 100. It is to be appreciated that a universal crosspoint switch configuration may be used for coupling the ART system 100 to two or more different types of remotes. For an implementation, a given crosspoint switch 124 may be specifically used for a given remote type. The crosspoint switch 124 may be operable to emulate one or more user actions by providing one or more electrical signals to a remote component configured to receive a user action. For at least one implementation, the emulation of a user action may occur without an actual pressing, swiping, or other user action occurring (by a user, by a machine, or otherwise) with respect to a given remote. For an implementation, the crosspoint switch 124 may utilize the JTAG (TM) standard, as standardized by the Joint Test Action Group, to facilitate testing of one or more user actions with respect to a given remote 148. Other approaches may be used for other implementations including non-standardized, custom, and other testing protocols and approaches. Crosspoint switches and the JTAG standard are well known and any currently available and/or later arising technology may be used.

Current Monitor 125

The main board 120 may be coupled to a current monitor 125 (an "I Monitor" in FIG. 1A). The current monitor 125 may be operable to monitor one or more electrical currents occurring within a given remote 148 at a given time and/or over a given time period. Current monitoring may occur at any time including, but not limited to, during testing, during idle times (when the remote is not actively being tested), and otherwise. For an implementation, the current monitor 125 may be operable to monitor currents drawn by light emitting elements, such as LEDs, on a remote 148. For an implementation, the current monitor 125 may be operable to monitor currents, such as discharge currents, drawn from a remote battery or other electrical energy storage device or source provided in and/or coupled to a remote 148. The current monitoring may occur at any given interval or periodicity including, but not limited to, at a rate of one-thousand samples per second. The current monitor 125 may include hardware and software for use in determining battery drain/use during various modes of operation for the remote 148. For an implementation, battery draining and/or other current monitoring determinations may be performed by a test executive 150. The current monitor 125 may be operable to monitor currents drawn by a given remote 148 from an external power source at a given time and/or over any given time interval. Any currently known and/or later arising current monitoring technologies may be used. For an implementation, a current monitor 125 may include one or more leads which may be positioned between two or more poles of a battery provided in a remote and electrical connectors provided in the remote for coupling the battery to the remote. For another implementation, the current monitor 125 may include one or more clips or other conductors operable for connecting to battery connections provided within or externally by a given remote 148. The current monitor 125 may be provided in whole with, in part with and/or separate from the main board 120. In FIG. 1A, the current monitor 125 is shown as being located proximate to the remote 148 and not an element of the main board 120 for purposes of illustration and not by limitation.

RF Transceiver 126

The main board 120 may be coupled to an RF transceiver ("RF XCVR" in FIG. 1A) 126. The RF transceiver 126 may send and/or receive remote output signals using RF signals. It is to be appreciated that a given RF signal may be defined by one or more "RF signal characteristics" including, but not limited to, center frequency, bandwidth, modulation scheme used, encryption used, signal strength, presence/absence of noise, and otherwise. The RF transceiver 126 may send and/or receive RF signals having one or more given signal characteristics. For at least one implementation, the RF signal characteristics may be compliant with the RF4CE (™) specification provided by Digi-Key Electronics of Thief River Falls, Minnesota, USA, RF transceivers 126 are well known and any currently available and/or later arising technologies may be used. A first remote may emit and/or receive first RF signals with one or more first RF signal characteristics while a second remote may emit and/or receive second RF signals with one or second RF signal characteristics. Accordingly, an RF transceiver 126 may be operable, for at least one implementation, for use with remotes emitting and/or receiving RF signals having one or more, RF signal characteristics. The RF transceiver 126 may be provided in whole with, in part with and/or separate from the main board 120. In FIG. 1A, the RF transceiver 126 is shown as being located at a first (left)(top) end of the remote 148 for purposes of illustration and not by limitation.

IR Transceiver 128

The main board 120 may be coupled to an IR transceiver ("IR XCVR" in FIG. 1A) 128. The IR transceiver 128 may be operable to send and/or receive remote output signals using IR signals. It is to be appreciated that a given IR signal may be defined by one or more "IR signal characteristics" including, but not limited to, center frequency, bandwidth, modulation scheme used, encryption used, signal strength, presence/absence of noise, and otherwise. The IR transceiver 128 may be operable to send and/or receive IR signals having one or more given IR signal characteristics. IR transceivers 128 are well known and any currently available and/or later arising technologies may be used. A first remote may be operable for use with one or more first IR signal characteristics while a second remote may be operable for use within one or second IR signal characteristics. Accordingly, an IR transceiver 128 may be operable for use with remotes operable for any given IR signal characteristics. The IR transceiver 128 may be provided in whole with, in part with and/or separate from the main board 120. In FIG. 1A, the IR transceiver 128 is shown as being located at a second (right)(bottom) end of the remote 148 for purposes of illustration and not by limitation.

Sound Module 129, Microphone(s) 130 and Speaker(s) 138

The main board 120 may be coupled to a sound module 129. The sound module 129 may be coupled to one or more microphones 130 and one or more speakers 138. The sound module 129, microphone(s) 130, and speaker(s) 138 may use any known or later arising technologies. The microphone(s) 130 may be operable to receive sounds (sound reactions) output by the remote 148. The speaker(s) 138 may be operable to output sounds at any given one or more frequencies including, but not limited to, at frequencies that are humanly perceptible, including humanly perceptible words, such as those between twenty hertz (20 Hz) and twenty-thousand hertz (20,000 Hz). The sound module 129 may be operable to generate a given sound, via the speaker(s) 138. Sounds generated by the sound module 129 and by the speaker(s) 138 may include, but are not limited to, beeps, buzzes, human words (in any of one or more languages), sequences of words (e.g., a command of "power on television" or "increase volume"), or otherwise. It is to be appreciated that a given sound may be defined by one or more "sound characteristics" including, but not limited to, frequency, rate, volume, syntax, or otherwise. In FIG. 1A, the sound module 129 is shown as being located proximate to the speaker(s) 138 and microphone(s) 130 for purposes of illustration and not by limitation. The speaker(s) 138 and microphone(s) 130 also may be positioned on the cradle 102 at any location and are shown in FIG. 1A at specific locations for purposes of illustration.

Camera 132 and Camera Mount 133

The main board 120 may be coupled to a camera 132. The camera 132 may be coupled to the cradle 102 using a camera mount 133. The camera mount 133 may facilitate positioning of the camera 132 along a given portion of the cradle 102 and with a given orientation relative to a part of a given remote 148 so as to provide a given field-of-view 134. Any given orientation for the camera 132 and/or the field-of-view 134 may be used for a given implementation. The camera 132 may include one or more lenses, image processors, data storage elements, and/or other elements common to still image and motion image cameras. The camera 132 may use any know or later arising imaging technology and may be operable to capture still image, moving image, time lapse images, or other images or sequences of images. The camera 132 may be operable for use under low light, night (dark), daytime, bright, or other lighting conditions. The camera 132 may be operable to include imaging processing software for use in image interpretation. One non-limiting example being detecting and measuring an intensity of light, color of light, sequence of lights, level, and location of backlighting, or otherwise as emitted by a remote 148, such as by one or more remote LEDs, screens, or the like and where such light emitting occurs in response to one or more test conditions and/or under one or more lighting conditions. Adjustments to the field-of-view 134 may occur in view of one or more testing script parameters and/or characteristics of a given remote 148 undergoing testing. For at least one implementation, including the illustrative implementation of FIG. 1A, the camera mount 133 may be positioned at a top right corner of the cradle 102, while being centered along the Z axis of the cradle 102. LED(s) 136

The main board 120 may be coupled to one or more LED(s) 136. The LED(s) 136 may be coupled to the cradle 102 at one or more positions in order to illuminate one or more given portions of the remote 148 under various testing conditions. The LED(s) 136 may be operable to output light at any lumen, color temperature, interval (such as continually, flashing, or strobing), or otherwise. The LED(s) 136 may be operated in accordance with one or more testing scripts to provide a given light environment. For example and not by limitation, the LED(s) 136 may be operable to illuminate the remote 148 so as to emulate a bright, daytime lighting condition. Under such conditions, the camera 132 may be used to detect and determine one or more lighting characteristics of the remote 148, such as the visibility of backlighting, visibility of LEDs on the remote, or otherwise.

USB Ports 140

The main board 120 may be coupled to one or more USB ports 140. The USB ports 140 may be coupled to one or more of the sound module 129, camera 132, LED(s) 136, current monitor 125, motor controller 123, crosspoint switch 124, DAM 121, test executive 150, and other components of an ART system 100.

External Connectors 142

One or more external connectors 142 may be used to communicate data between electrical components in the ART system 100 including, but not limited to, between the main board 120, the DAM 121, the motor 106, and others and with external components such as the test executive 150. External connectors 142 may include communications and network systems, technologies, protocols, and the like. External connectors 142 may couple the main board 120 and other ART system 100 components with data processing, storage, and other components used in testing a given remote 148. External connectors 142 may also couple one or more appliances with an ART system 100. Non-limiting examples of external connectors 142 include USB cables (3.0, 2.0, 1.0 and otherwise), firewire cables, copper twisted pair cable, copper wires, RG6 cables, serial cable, parallel cables, coaxial cables, fiber optic cables, Ethernet cables, and others. Any known or later arising technologies operable for communicating data (as represented by one or more electrical signals) via wired or wireless signals may be used.

Power Module 144

The main board 120 may be coupled to a power module 144. The power module 144 may be coupled to an electrical energy source, for example and not by limitation, a battery (not shown) or a line power source (not shown). The power module 144 may provide electrical power directly or indirectly to the main board 120, the motor 106, and other Art system 100 testing components via one or more power connectors 146. Power connectors 146 may provide electrical power directly, via inductive coupling, or otherwise. Non-limiting examples of power connectors 146 include USB cables, firewire cables, copper twisted pair cable, copper wires, RG6 cables, serial cable, parallel cables, coaxial cables, and others. Any known or later arising technologies operable for providing electrical power via wired or wireless signals may be used.

Accelerometer 149

The main board 120 may be coupled to one or more accelerometers 149. For at least one implementation, the accelerometers 149 may be configured to determine an orientation of the cradle 102 and, thereby the remote 148, in the X-Y-Z coordinate system under one or more testing conditions. The accelerometers 149 detect and determine an acceleration of the cradle 102 and, thereby the remote 148, under one or more testing conditions. Such acceleration may include a rotational acceleration and/or a lateral acceleration along one or more of the X-Y-Z axes. In FIG. 1A, the accelerometers 149 are shown as being located near the LED(s) 136 for purposes of illustration and not by limitation. The accelerometers 149 may be provided anywhere on the cradle 102 that is suitable for measuring position and/or acceleration of the cradle 102 at any given time and/or over any given period.

Test Executive 150

At least one implementation of the present disclosure may include, in conjunction with an ART system 100 or separately, a test executive 150. As shown for purposes of illustration and not by limitation, the test executive 150 may be coupled to the ART system 100 by external connector 142. For at least one implementation, such coupling may occur via the USB port 140 of the ART system 100 and the interface port 178 of the test Executive 150. Direct or indirect coupling may also and/or alternatively used. The test executive 150 may be implemented using any data processing device or system. Non-limiting examples of data processing devices and systems include personal computers, mainframe computer servers, networked computer servers, web servers, and otherwise. An implementation of a test executive 150 is further shown and described with respect to FIG. 1B.

Hardware Processor 154

Figure 1B:
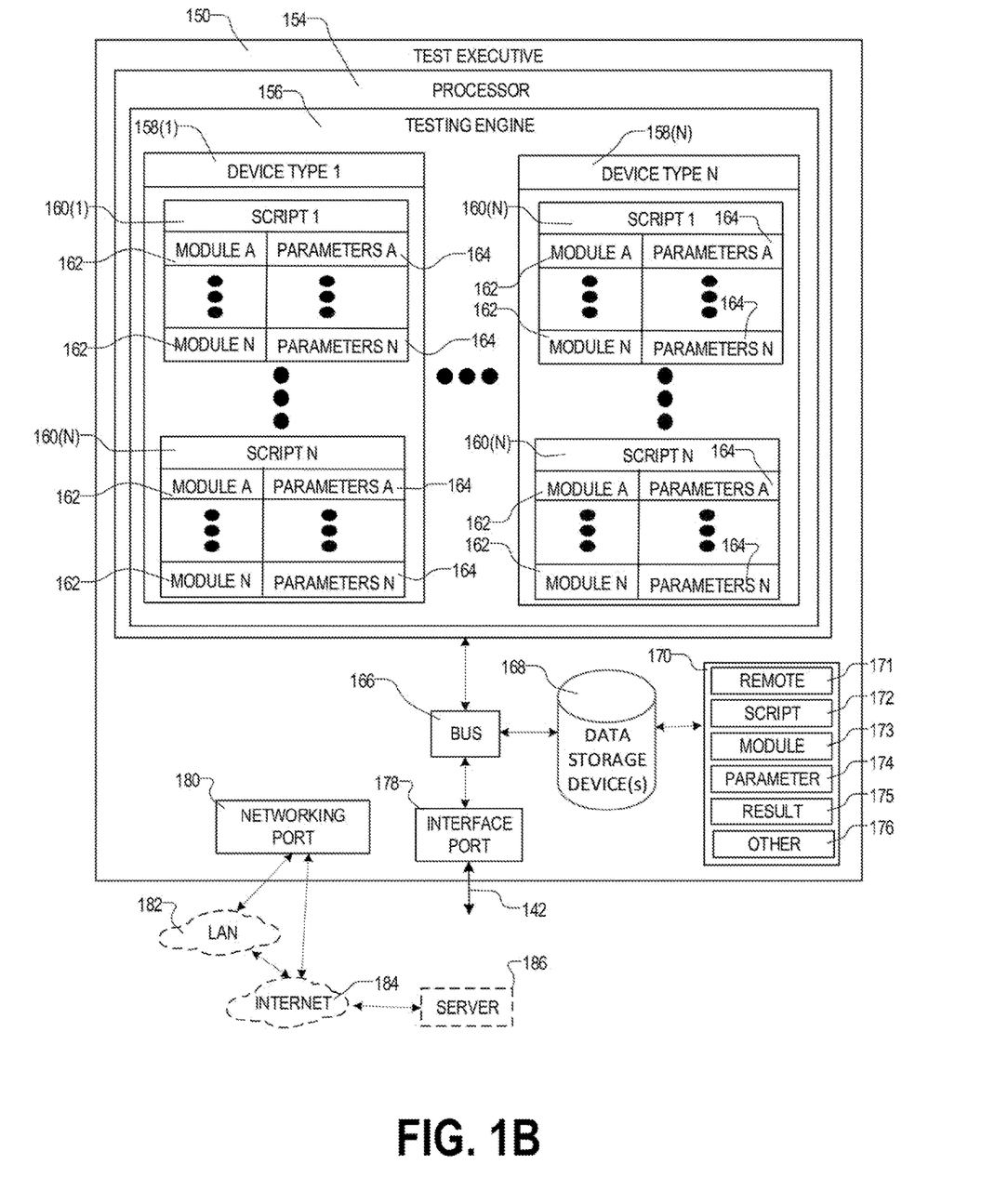

The test executive 150 may include a hardware processor 154. The hardware processor 154 may be operable to perform any data, sound, and/or signal processing capabilities. For at least one implementation, the hardware processor 154 may have access to one or more non-transient processor readable instructions, including instructions for executing one or more applications, engines, and/or processes operable to instruct the processor to perform non-transient computer executable instructions (hereafter, "computer instructions"). The hardware processor 154 may use any known or later arising processor including, but not limited to, processors having the capabilities of a 32-bit or 64-bit, multi-core ARM based processor.

Testing Engine 156

The hardware processor 154 may be operable to facilitate one or more computer engines, such as testing engine 156. The testing engine 156 may execute at least one computer instruction. For at least one implementation, the testing engine 156 may execute computer instructions based upon a device type 158 for a given remote 148 under test. For at least implementation, a testing engine 156 may include use of LABVIEW software, as provided by National Instruments Corp., USA. As shown, execution of computer instructions for any number of device types 158(1)-158(N), where "N" is an integer, may be supported by a given testing engine 156. Multiple testing engines may be provided by a test executive 150. Such multiple testing engines may facilitate parallel testing of a given remote's 148 firmware and/or other operating characteristics by use of multiple remotes 148 supported by multiple, independent cradles 102.

Device types 158 may correspond to a type of remote, a version of firmware, or otherwise. For example, the testing engine 156 may be configured to test multiple versions of firmware singularly, in parallel, or otherwise.

A testing engine 156 may be configured to execute computer instructions providing one or more testing scripts ("scripts") 160. A testing script may provide a sequence of testing instructions (aka, testing operations) to be performed by an ART system 100, with respect to a given remote 148 and in view of a given device type 158. A script 160 may include one or more sequences of emulated user actions. Results and reactions by the remote, as captured by the Art system 100 and communicated to the test executive 150, may be logged, stored, analyzed, and the like in the data storage device 168.

A script 160 may include one or more modules 162. A module 162 may include one or more testing instructions for the Art system 100 to perform and which emulate one or more user actions, such as a button push, a verbal input, or the like. A module 162 may include multiple combinations of user actions. A script may include one or more parameters 164. A given parameter 164 may be specific to a given module 162, common to one or more modules 162, or used for any modules. For example, a module 162 for use in detecting sounds output by a given remote 148 may not include use of the camera 132, whereas it may include use of a current monitor 125. One or more of the various testing components used for a given module 162 may be specified as one or more parameters 164. A parameter 164 may specify a duration, interval, sequence, condition (e.g., bright LED light versus no LED light) or otherwise. A parameter 164 may specify a direction of movement of the cradle 102, such as a rotational direction to be applied by the motor 106, a number of "steps" of such rotation (when the motor is a stepper motor), vibration(s) applied to the remote 148, torque applied to the cradle 102, rotational speed of the cradle 102, accelerations at particular orientations of the cradle 102, and the like. It is to be appreciated that an ART system 100 facilitates a testing of a remote 148 under numerous permutations of user actions, remote orientations, cradle movements, and the like. In at least one implementation, a script 160 may be provided in text file interpretable by the testing engine 156. The text file may also be provided in a humanly interpretable format.

Bus 166

The testing engine 156 may include a bus 166 or similar data transport architecture. Any known or later arising bus technology may be used. The bus 166 may couple together one or more of the hardware processor 154, data storage device 168, interface port 178, networking port 180, and other components together.

Data Storage Device 168

The test executive 150 may include one or more data storage devices 168. The data storage device 168 may be operable using any known or later arising data storage technologies. The data storage device 168 may use one or more data storage technologies including, but not limited to, flash memory, micro-SD card, solid-state drive, hard drive, optical drive, arrays of storage devices, or otherwise. The data storage device 168 may have any suitable data storage size, data transfer (read/write) speed, provide redundancy and backup capabilities, or otherwise. The data storage device 168 facilitates temporary/transient and/or permanent/non-transient storage of one or more data sets, computer instructions, and/or other information in one or more databases 170.

Database 170

The database 170 may be provided local to the test executive 150, remote thereto, and/or combinations of the foregoing. Any known or later arising database technology may be used. The database 170 may be configured using any ontology or model including, but not limited to, relational, hierarchical, network, inverted file, entity-relationship, object-oriented, document, entity-attribute-value, star, associated, correlational, multidimensional, multi-value, semantic, XML, or otherwise. The database 170 may store data, computer instructions, and the like in one or more data sets. Non-limiting examples of data set may include a remote data set 171, a script data set 172, a module data set 173, a parameter data set 174, a result data set 175, and other data set 176.

For at least one implementation, a remote data set 171 may include data corresponding to a given model of a remote 148, a firmware version, elements of a remote (such as the number and type of user input components and user output components), capabilities of a remote 148, and otherwise.

A script data set 172 may include a listing or other representation of scripts available for testing one or more remotes 148. The script data set 172 may also identify, for example and not by limitation, one or more module data sets 173 and/or parameter data sets 174 that may be provided by and/or associated with a given script or a collection of scripts. It is to be appreciated that scripts may be pre-determined, auto-generated (for example and not by limitation, by use of artificial intelligence and other processes), manually generated, or otherwise.

A module data set 173 may identify a particular testing sequence to be performed. Non-limiting examples may include a pre-determined sequence of operations, such as button presses or other user actions, that are to be emulated during a testing script. A module data set 173 may also be configured to include sequences of operations that are randomly selected, manually selected, semi-automatically selected, selected by use of artificial intelligence, selected in view of already existing testing, anomaly, error, or other reports, or otherwise.

A parameter data set 174 may include one or more parameters corresponding to a given user action that is to be simulated during testing of a remote 148 by the ART system 100. Non-limiting examples of testing parameters include length of selection of a user input component, such as a length of time for pressing of a button, a length of delay between button presses, a direction of a swipe on a touch interface, a speed of a swipe on a touch interface, a pacing of speech (for an audible user input component), and otherwise. It is to be appreciated that the parameter data set 174 may be populated based upon module, script, device and other data sets with respect to which a given parameter data set 174 may be utilized.

A result data set 175 may include one or more data files providing data regarding testing results for one or more remotes 148. The result data set 175 may be populated based on individual testing results, aggregated results, correlated results, or otherwise. The result data set 175 may include data files corresponding, for example, to one or more parameters, modules, scripts, and devices, combinations and permutations of the foregoing, and otherwise.

An "other" data set 176 may include any other data useful in testing, interpreting, reporting, processing, outputting, or otherwise testing one or more remotes 148 use the ART system 100.

Interface Port 178

A testing executive 150 may include an interface port 178 for coupling the test executive 150 with the ART system 100, with non-ART system components (such as remotes), and otherwise. One non-limiting example of an interface port 178 is a universal serial bus (USB) port. Other non-limiting examples, include FIREWIRE ports, serial ports, parallel ports, BLUETOOTH components, ZIGBEE, Near Field Communications, and otherwise. Any known or later arising wired and/or wireless interface port technology may be used. The interface port 178 may couple the hardware processor 154 and/or other test executive 150 components (via e.g., the bus 166) to one or more user input devices and/or one or more user output devices. Non-limiting examples of user input devices include keyboards, touch screens, mouses, joysticks, voice input receiving devices, and the like. Non-limiting examples of user output devices include displays, lights, printers, audible sound generating devices (e.g., speakers and buzzers), and otherwise. Any known or later arising user input and/or user output device technologies may be used. The interface port 178 may be operable to support the transfer of data formatted using any protocol and at any data rates/speeds. The interface port 178 may be connected to one or more antennas (not shown) to facilitate wireless data transfers. Such antenna may support short-range technologies, such as 802.11a/c/g/n and others, and/or long-range technologies, such as 4G, 5G, and others. The interface port 178 may be operable to communicate signals using terrestrial systems, space-based systems, and combinations thereof systems.

Networking Port 180

A test executive 150 may include a networking port 180 for coupling the test executive 150 with networking components, such as a local area network (LAN) 182, the Internet 184, one or more remote servers 186, remote databases (not shown), or otherwise. One non-limiting example of a networking port 180 is an Ethernet card, cards (or the like) supporting other communications technologies may be used including, for example and not by limitation, Narrowband IOT, WIFI, 3G, 4G, 5G, and cellular. Any known or later arising technologies may be used in coupling the test executive 150 to any other device, computer, server, database, or otherwise. The networking port 180 may be operable to support the transfer of data formatted using any protocol and at any data rates/speeds. The networking port 180 may be connected to one or more antennas (not shown) to facilitate wireless data transfers. Such antenna may support short-range technologies, such as 802.11a/c/g/n and others, and/or long-range technologies, such as 4G, 5G, and others. The networking port 180 may be operable to communicate signals using terrestrial systems, space-based systems, and combinations thereof systems.

Although various implementations have been described above with a certain degree of particularity, or with reference to one or more individual implementations, those skilled in the art could make numerous alterations to the disclosed implementations without departing from the spirit or scope of the claims. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more implementations of the present disclosure. It is also to be appreciated that the terms "top" and "bottom", "left" and "right", "up" or "down", "first", "second", "next", "last", "before", "after", and other similar terms are used for description and ease of reference purposes and are not intended to be limiting to any orientation or configuration of any elements or sequences of operations for the various implementations of the present disclosure. Further, the terms "coupled", "connected" or otherwise are not intended to limit such interactions and communication of signals between two or more devices, systems, components or otherwise to direct interactions; indirect couplings and connections may also occur. Further, the terms "and" and "or" are not intended to be used in a limiting or expansive nature and cover any possible range of combinations of elements and operations of an implementation of the present disclosure. Other implementations are therefore contemplated. It is intended that the matter contained in the above description and shown in the accompanying drawings shall be interpreted as illustrative implementations and not limiting. Changes in detail or structure may be made without departing from the basic elements recited in the following claims. A reference herein to an "electrical device" includes "electronic devices" and other devices operable to perform a given operation of facilitate a given function of a device.

Further, a reference to a computer executable instruction includes the use of computer executable instructions that are operable to perform a predefined set of basic operations in response to receiving a corresponding basic instruction selected from a predefined native instruction set of codes. It is to be appreciated that such basic operations and basic instructions may be stored in a data storage device non-transiently, may be updateable, and are non-transient as of a given time of use thereof. The storage device may be any device operable to store the instructions and is communicatively coupled to a processor operable to execute such instructions. The storage device and/or processors utilized operate independently, dependently, in a non-distributed or distributed processing manner, in serial, parallel or otherwise and may be located remotely or locally with respect to a given device or collection of devices operable to use such instructions to perform one or more operations.

What is claimed is:

1. A device comprising:
   a main board;
   a data acquisition module (DAM) coupled to the main board; and
   one or more testing components coupled to the main board;
   wherein the main board is operable to communicate a testing instruction to the one or more testing components;
      wherein the one or more testing components comprise:
         a cradle operable to hold a remote control device under test (RUT); and
         a motor;
            wherein the motor is physically coupled to the cradle and operable to rotate the cradle about at least one axis of a coordinate system; and
   wherein, based on the testing instruction, the one or more testing components provide one or more stimuli to the RUT;
   wherein the one or more stimuli comprise at least one emulated user action and a rotation of the cradle imparting a rotation to the RUT; and
   wherein the DAM is operable to receive, from the one or more testing components, one or more result data indicative of one or more reactions by the RUT to the one or more stimuli.

2. The device of claim 1,
   wherein at least one of the one or more stimuli is provided to the RUT and at least one of the one or more result data is received by the DAM from at least one of the one or more testing components.

3. The device of claim 1,
   wherein a first testing component provides a first stimuli to the RUT substantially simultaneously with a second testing component providing a second stimuli to the RUT.

4. The device of claim 3,
   wherein the first stimuli is an acceleration of the RUT; and
   wherein the second stimuli is an emulated user action.

5. The device of claim 4,
   wherein the emulated user action emulates at least one of a button press, a button release, an audible input, and a touch screen action.

6. The device of claim 1,
wherein the one or more testing components comprise:
a crosspoint switch operable to generate an emulated user action; and
wherein the one or more stimuli comprises at least one emulated user action.

7. The device of claim 6,
wherein the remote under test includes a remote battery;
wherein the one or more testing components further comprise:
a current monitor, coupled to the DAM; and
wherein the current monitor is operable to capture a testing result corresponding to the one or more reactions by the RUT and provide the test result to the DAM.

8. The device of claim 1,
wherein the one or more testing components further comprise:
a cradle operable to hold the RUT;
a motor;
wherein the motor is physically coupled to the cradle and operable to rotate the cradle about at least one axis of a coordinate system; and
wherein the one or more stimuli comprises a rotation of the cradle imparting a rotation to the RUT.

9. The device of claim 8,
wherein the one or more testing components comprise:
a crosspoint switch operable to generate an emulated user action; and
at least one of a radio frequency (RF) transceiver and an infrared (IR) transceiver;
wherein the one or more stimuli comprises at least one emulated user action; and
wherein the RUT is operable to generate at least one of an RF signal and an IR signal; and
wherein the one or more result data include at least one of the RF signal and the IR signal generated by the RUT and in reaction to the one or more stimuli.

10. The device of claim 8,
wherein the one or more testing components comprise:
a crosspoint switch operable to generate an emulated user action;
a light emitting diode (LED) operable to provide a light environment to the RUT; and
a camera operable to capture one or more images of the RUT and at least one of the one or more reactions by the RUT to the one or more stimuli.

11. The device of claim 10,
wherein the at least one of the one or more reactions by the RUT include an illumination of a remote LED.

12. The device of claim 8,
wherein the one or more testing components comprise:
a crosspoint switch operable to generate an emulated user action;
a sound module operable to at least one of:
output a sound to the RUT, and
capture a sound reaction from the RUT; and
wherein the sound reaction is at least one of the one or more reactions by the RUT to the one or more stimuli.

13. The device of claim 12,
wherein the sound reaction includes one or more humanly perceptible words.

14. A device comprising:
a main board;
a data acquisition module (DAM) coupled to the main board; and
one or more testing components, coupled to the main board, including a current monitor and a crosspoint switch;
wherein the main board is operable to communicate a testing instruction to the current monitor;
wherein the crosspoint switch is operable to generate an emulated user action;
wherein, based on the testing instruction, the one or more testing components provide one or more stimuli to a remote control device under test (RUT);
wherein the one or more stimuli comprises at least one user action;
wherein the RUT includes a remote battery;
wherein the current monitor is operable to capture a testing result and provide the testing result to the DAM;
wherein the testing result includes one or more result data indicative of one or more reactions by the RUT to the one or more stimuli;
wherein the DAM is operable to receive the testing result;
wherein the testing result is a change in a discharge current from the remote battery; and
wherein the testing result is captured by the current monitor in response to the providing of the one or more stimuli to the RUT.

15. The device of claim 14,
wherein the testing result is captured by the current monitor substantially simultaneously with the providing of the one or more stimuli to the RUT.

16. A system comprising:
an automated remote testing (ART) system comprising:
a main board;
a data acquisition module (DAM) coupled to the main board;
one or more testing components coupled to the main board;
wherein the one or more testing components comprise:
a crosspoint switch operable to generate an emulated user action;
a cradle operable to hold a remote control device under test RUT); and
a motor;
wherein the motor is physically coupled to the cradle and operable to rotate the cradle about at least one axis of a coordinate system; and
wherein the main board is operable to communicate a testing instruction to the one or more testing components;
wherein, based on the testing instruction, the one or more testing components provide one or more stimuli to the RUT;
wherein the one or more stimuli comprise at least one emulated user action and a rotation of the cradle imparting a rotation to the RUT;
wherein the DAM is operable to receive, from the one or more testing components, one or more result data indicative of one or more reactions by the RUT to the one or more stimuli; and
a testing executive comprising:
a hardware processor operable to execute non-transient computer executable instructions facilitating a testing engine;
wherein the testing engine is operable to generate the testing instruction based upon at least one testing script; and wherein the hardware processor outputs the testing instruction to the ART system.

* * * * *